United States Patent
Oda

(10) Patent No.: US 9,680,297 B2
(45) Date of Patent: Jun. 13, 2017

(54) CURRENT DIFFERENTIAL RELAY

(75) Inventor: Shigetoo Oda, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 398 days.

(21) Appl. No.: 14/409,311

(22) PCT Filed: Jun. 26, 2012

(86) PCT No.: PCT/JP2012/066278
§ 371 (c)(1),
(2), (4) Date: Dec. 18, 2014

(87) PCT Pub. No.: WO2014/002191
PCT Pub. Date: Jan. 3, 2014

(65) Prior Publication Data
US 2015/0171621 A1 Jun. 18, 2015

(51) Int. Cl.
*H02H 7/26* (2006.01)
*H02H 3/00* (2006.01)
(Continued)

(52) U.S. Cl.
CPC ............ *H02H 7/263* (2013.01); *H02H 3/006* (2013.01); *H02H 3/30* (2013.01); *G01R 19/2513* (2013.01)

(58) Field of Classification Search
CPC .......... H02H 3/006; H02H 3/30; H02H 7/263; G01R 19/251
(Continued)

(56) References Cited

U.S. PATENT DOCUMENTS

| 6,678,134 B2 | 1/2004 | Sugiura et al. |
| 8,107,205 B2 | 1/2012 | Adachi |
| 2010/0302697 A1* | 12/2010 | Adachi ................... H02H 3/30 361/87 |

FOREIGN PATENT DOCUMENTS

| GB | 2474323 A | 4/2011 |
| JP | 9-166640 A | 6/1997 |

(Continued)

OTHER PUBLICATIONS

International Search Report (PCT/ISA/210) mailed on Aug. 28, 2012, by the Japanese Patent Office as the International Searching Authority for International Application No. PCT/JP2012/066278.
(Continued)

*Primary Examiner* — Rexford Barnie
*Assistant Examiner* — Toan Vu
(74) *Attorney, Agent, or Firm* — Buchanan Ingersoll & Rooney PC

(57) ABSTRACT

MUs and IEDs are included. Each of the IEDs includes a signal control unit that derives the time difference between the sampling timings in the MUs on the basis of digital data from one end of a protection area and digital data from the other end of the protection area, controls the cycle of a sampling-timing control signal to eliminate this time difference, and outputs this controlled sampling-timing control signal to a merging unit corresponding to each computation unit. Each of the MUs includes a control-signal output circuit that generates a sampling signal synchronized with the sampling-timing control signal from the IEDs and outputs this sampling signal as a control signal, and a data output unit that converts an electrical input to digital data and outputs the digital data.

4 Claims, 8 Drawing Sheets

(51) Int. Cl.
*H02H 3/30* (2006.01)
*G01R 19/25* (2006.01)

(58) Field of Classification Search
USPC .......................................................... 361/64
See application file for complete search history.

(56) References Cited

FOREIGN PATENT DOCUMENTS

| | | |
|---|---|---|
| JP | 11-191919 A | 7/1999 |
| JP | 2000-78740 A | 3/2000 |
| JP | 2000-228821 A | 8/2000 |
| JP | 2002-186166 A | 6/2002 |
| JP | 2005-27464 A | 1/2005 |
| JP | 2008-61451 A | 3/2008 |
| JP | 2010-279235 A | 12/2010 |
| JP | 2011-15543 A | 1/2011 |
| JP | 2011-83167 A | 4/2011 |
| JP | 2011-200100 A | 10/2011 |
| JP | 2012-65433 A | 3/2012 |

OTHER PUBLICATIONS

Written Opinion (PCT/ISA/237) mailed on Aug. 28, 2012, by the Japanese Patent Office as the International Searching Authority for International Application No. PCT/JP2012/066278.

* cited by examiner

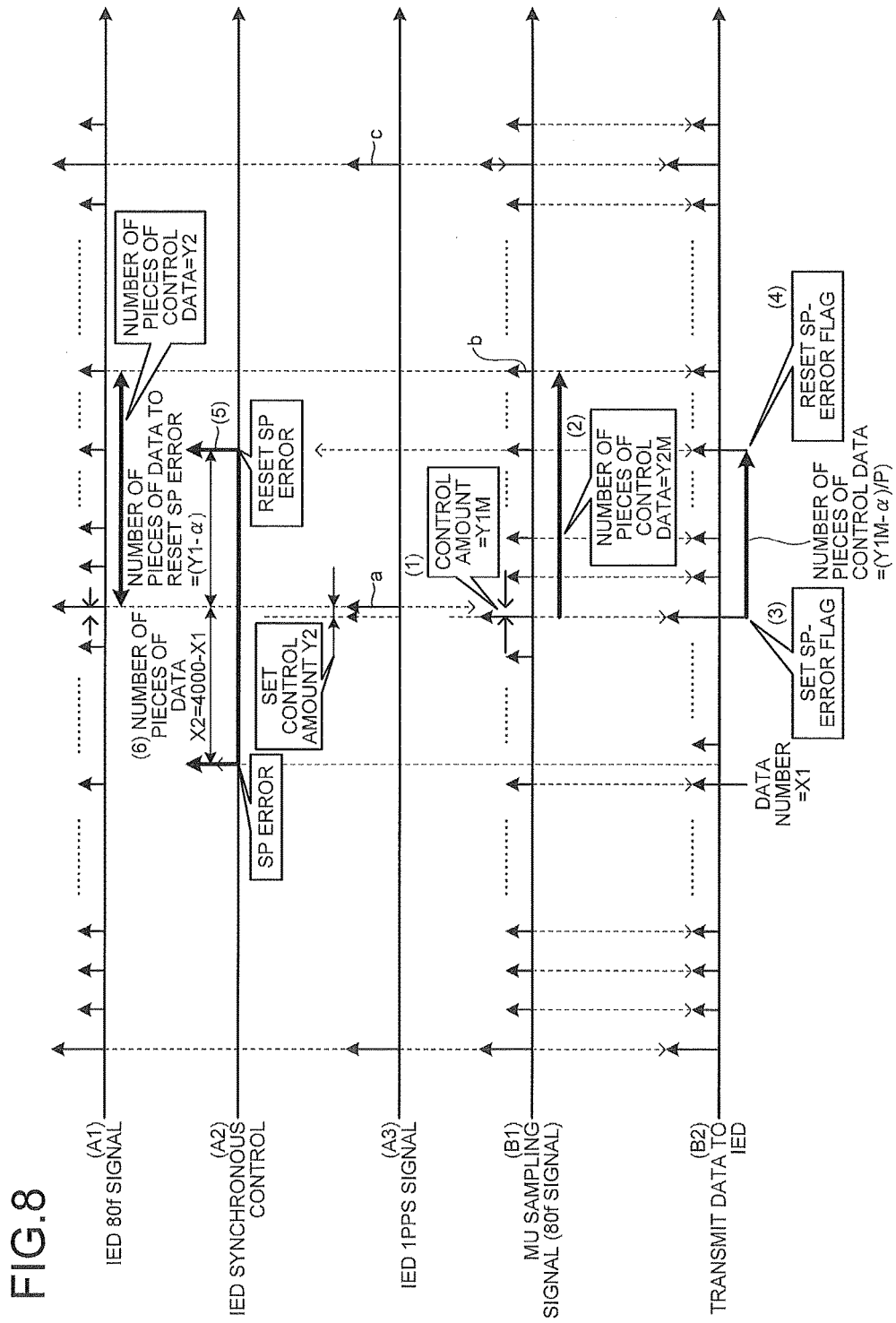

CURRENT DIFFERENTIAL RELAY

FIELD

The present invention relates to a process bus-compatible current differential relay that protects a power transmission line in an electric power system.

BACKGROUND

A conventional current differential relay for a power transmission line is provided at both ends of a protected area on a power transmission line (hereinafter, "both ends of the power transmission line"). The current differential relays obtain electric current information from a current transformer used for obtaining a power-transmission-line current into the relay, mutually transmit the electric current information to the other end via a PCM transmission path, and compute a differential current between the currents flowing into both ends of the power transmission line to detect whether there is an internal fault in the power transmission line. When the internal fault is detected, the current differential relays operate and open a breaker provided at both ends of the power transmission line to cut off the power-transmission-line segment from the electric power system. In order to compute the differential current, the current differential relays provided at both ends of the power transmission line are controlled such that the sampling timings of analog-to-digital (AD) conversion of a current that is input to these current differential relays are synchronized with each other.

In conventional techniques, there have been proposed a method of synchronizing the above sampling timings by using a PCM transmission device that is specially configured to match the transmission delay times in a PCM transmission path between one end and the other end and a method of, in the case where the transmission delay times differ from each other between one end and the other end, synchronizing the above sampling timings by inputting a global-positioning-system (GPS) time signal and using the time signal that is input at the same time to the current differential relays provided at both ends of the power transmission line (for example, Patent Literature 1).

As a conventional technique, there has been proposed a method of synchronizing the above sampling timings by using a 1-pulse-per-second (1PPS) signal as the GPS time signal in the above latter technique to generate a 50-Hz or 60-Hz clock or a 600-Hz or 720-Hz clock from the 1PPS signal (for example, Patent Literature 2). The 1PPS signal is a highly accurate 1-pulse-per-second time signal generated on the basis of the GPS time signal. However, the GPS time signal is transmitted from the satellite and is therefore affected by the location of the satellite, weather, and other factors. Accordingly, the GPS time signal is not stable enough to be constantly received. Thus, in the conventional technique in Patent Literature 1, a current differential relay is configured to be able to continue its operation even when the GPS time signal is lost.

Meanwhile, a protective relay in which its functions are divided into two main functions is referred to as "process bus-compatible protective relay". The process bus-compatible protective relay is constituted by a merging unit (MU: Merging Unit) and a relay computation unit (IED: Intelligent Electric Device). The merging unit is provided adjacent to the main unit body in a gas insulated substation (GIS) or the like, which is configured from a current transformer and other devices in a substation, and converts current and voltage input data to digital data to transmit the digital data to a communication circuit. The relay computation unit is provided at a location apart from the MU (for example, in a protection control room in the substation) and performs relay computation. The MU and the IED are communicated according to the protocol referred to as a process bus defined in the IEC 61850 communication standards.

CITATION LIST

Patent Literatures

Patent Literature 1: Japanese Patent Application Laid-open No. 2008-61451 (paragraphs [0008], [0009])
Patent Literature 2: Japanese Patent Application Laid-open No. 2000-228821 (paragraph [0010] and FIG. 13)

SUMMARY

Technical Problem

In contrast to the conventional protective relays described in Patent Literatures 1 and 2 mentioned above, as described above, the process bus-compatible protective relay is configured such that it is separated into a circuit (the MU) that processes current and voltage electrical inputs in an analog manner and converts these inputs to digital data and a circuit (the IED) that receives the digital data and performs digital computation. In the case where this process bus-compatible protective relay is a current differential relay, the IEDs, respectively provided at both ends of the power transmission line, perform data communication with each other through the PCM transmission path. However, the MU and the IED are separated from each other, and therefore it is difficult in the conventional technique to execute the sampling-synchronization control for AD conversion within the MU on the basis of the results synchronously computed by this communication. The reason for this is that the synchronous control in the MU is executed by a 1PPS signal from the IED, and therefore there is a possibility for the time synchronization in each of the IEDs provided at both ends of the power transmission line to be delayed by approximately one second at the maximum because sampling in the MU is controlled by the 1PPS signal. Another reason for this is that the TCP/IP-based protocol is applied to the communication line according to the process-bus standard, and therefore there are fluctuations in the data-communication delay time from the MU to the IED of approximately several tens to several hundreds of milliseconds.

The present invention has been achieved in view of the above and an object of the present invention is to provide a process bus-compatible current differential relay that can correctly maintain sampling synchronization without being affected by fluctuations in the digital-data communication time from an MU to an IED.

Solution to Problem

In order to solve the above problems and achieve the object, the present invention relates to a current differential relay, where the current differential relay is provided in plural, and the current differential relays are provided at both ends of a protected segment and transmit and receive digital data regarding an electric quantity of the relays to and from each other, wherein each of the current differential relays, which are provided at both ends of a protected segment, includes: a merging unit that merges an electrical input detected in an own terminal, samples the electrical input, samples the electrical input, converts the electrical input to digital data, and outputs the digital data; and a computation unit that is located apart from the merging unit, is connected to the merging unit through a data communication bus, and performs differential computation using digital data from the merging unit in the own terminal and digital data from the merging unit in another terminal, which is transmitted from the computation unit in the another terminal through a PCM transmission line, each of the computation units includes: a signal control unit that derives a time difference in sampling timing between a sampling-timing control signal from the computation unit to the merging unit in the own terminal and a sampling-timing control signal from the computation unit to the merging unit in the another terminal, on a basis of digital data in the own terminal and digital data in the another terminal, that controls a cycle of a sampling-timing control signal on a basis of the time difference, and that outputs the controlled sampling-timing control signal to the merging unit in the own terminal; and a signal transmission unit that, when a time-signal reception unit, which receives a GPS time signal, normally receives the GPS time signal, transmits a 1PPS signal from the time-signal reception unit to the merging unit in the own terminal as the sampling-timing control signal, and that, when the time-signal reception unit does not normally receive the GPS time signal, transmits an 80f signal from the signal control unit to the merging unit in the own terminal as the sampling-timing control signal, and each of the merging units includes: a control-signal output circuit that generates a sampling signal synchronized with the sampling-timing control signal and that outputs the sampling signal as a control signal; and a data output unit that converts the electrical input to digital data and outputs the digital data on a basis of a control signal from the control-signal output circuit.

Advantageous Effects of Invention

According to the present invention, an IED derives the sampling-synchronization control amount and also transmits a sampling-timing control signal, controlled on the basis of this sampling-synchronization control amount, to an MU. Therefore, an effect is obtained where sampling synchronization can be correctly maintained without being affected by fluctuations in the digital-data communication time from the MU to the TED.

BRIEF DESCRIPTION OF DRAWINGS

FIG. 8 is an explanatory diagram of an operation of a current differential relay according to the third embodiment of the present invention.

DESCRIPTION OF EMBODIMENTS

Exemplary embodiments of a current differential relay according to the present invention will be explained below in detail with reference to the accompanying drawings. The present invention is not limited to the embodiments.

First Embodiment.

Figure 1:
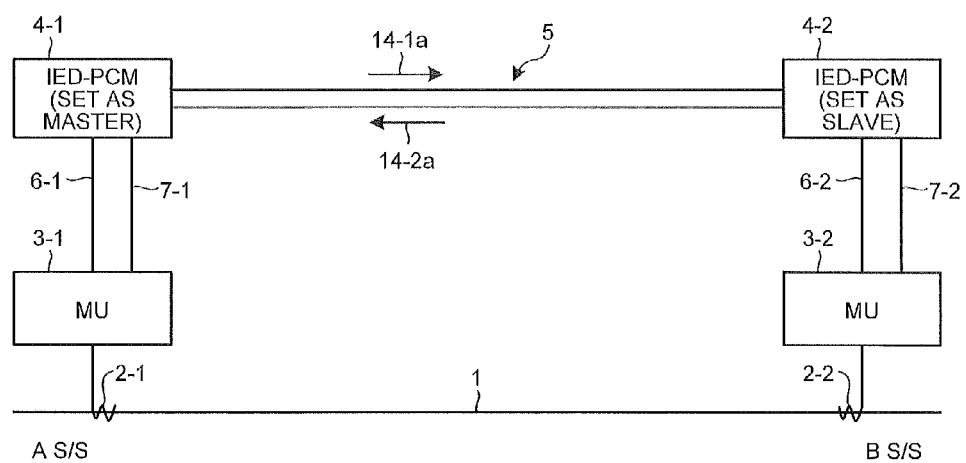
FIG. 1 is a configuration diagram of a current differential relay according to first to third embodiments of the present invention.

FIG. 1 is a configuration diagram of a current differential relay according to first to third embodiments of the present invention. In the following descriptions of the drawings, the same or similar constituent elements are denoted by like or similar reference signs. FIG. 1 shows a power transmission line 1 between a substation A (hereinafter, "AS/S") and a substation B (hereinafter, "BS/S"), a plurality of instrument transformers (hereinafter, "CTs") 2-1 and 2-2 that are provided on the power transmission line 1, an MU 3-1 that captures a CT secondary current detected by the CT 2-1, an MU 3-2 that captures a CT secondary current detected by the CT 2-2, an IED 4-1 that is connected to the MU 3-1 through a process bus 6-1 and a sampling-timing control-signal cable 7-1, and an IED 4-2 that is connected to the MU 3-2 through a process bus 6-2 and a sampling-timing control-signal cable 7-2.

While two CTs 2 are shown in FIG. 1 to simplify the following explanations, there are three power transmission lines 1 corresponding to three phases, and the CTs 2 are provided for each of the three phases. Each of the MUs 3 merges CT secondary currents detected by these CTs 2 and converts the merged CT secondary current from analog to digital data. While each of the MUs 3 shown in FIG. 1 is configured to capture a CT secondary current as an example, it can be configured to capture a secondary voltage of an instrument transformer (PT) along with the CT secondary current.

In the present embodiment, as an example, the IED 4-1 is set as a master terminal and the IED 4-2 is set as a slave terminal. However, these settings can be reversed. For additional details regarding the master terminal and the slave terminal, in the TED 4-1 and the IED 4-2 provided at both ends of the power transmission line, when a 1PPS signal from a GPS receiver (not shown) is lost or a GPS time signal is not normally received (hereinafter, "when a GPS time signal is lost or similar occurrences"), the master terminal controls the sampling timing of the MU 3 using an 80f signal generated by a clock in the IED, and the slave terminal generates, in the IED, an 80f signal, which is synchronized with current data transmitted from the master terminal through a PCM transmission path 5, and controls the sampling timing of the MU 3 using the generated clock. "f" in the 80f signal represents a rated frequency in an electric power system. When "f" is 50 Hz, the 80f signal is a signal with a frequency equal to 4000 Hz.

In the MU 3-1, a CT secondary current from the CT 2-1 is converted from analog to digital data and is converted to serial data via a digital process. This serial data is transmitted to the IED 4-1 through the process bus 6-1. Similarly, in the MU 3-2, a CT secondary current from the CT 2-2 is converted from analog to digital data, current data 14-2a is converted to serial data, and the serial data is transmitted to the IED 4-2 through the process bus 6-2 via a digital process.

Each of the IEDs 4 having a function of the current differential relay is provided in a control room, a relay room, or other locations. The IED 4-1 captures the serial data from the MU 3-1, decodes this serial data to obtain current data, and performs protection computation using this current data. Similarly, the IED 4-2 captures the serial data from the MU 3-2, decodes this serial data to obtain current data, and performs protection computation using this current data. Specifically, between the IEDs 4, current data 14-1a and the current data 14-2a, which are transmitted and received to and from the IEDs 4 at both ends through the PCM transmission path 5, are used to perform differential-current computation between a sample of the current data in the own terminal and a sample of the current data in the counterpart terminal, which are obtained at the same time (in practice, vector sum computation because the CTs at both ends are provided so as to have reverse polarities), in order to determine whether an internal fault has occurred on the power transmission line 1 or an external fault has occurred. When it is determined that an internal fault has occurred, an opening command is output to breakers (not shown) provided on the power transmission line 1 of the AS/S and the BS/S, and then the breakers operate to cut off the power transmission line 1 on which the fault has occurred from the electric power system. Each of the IEDs 4 has a signal control unit 23 incorporated therein, where the signal control unit 23 synchronously controls the sampling timing of AD conversion in the MUs 3-1 and 3-2 provided at both ends of the power transmission line.

Figure 2:
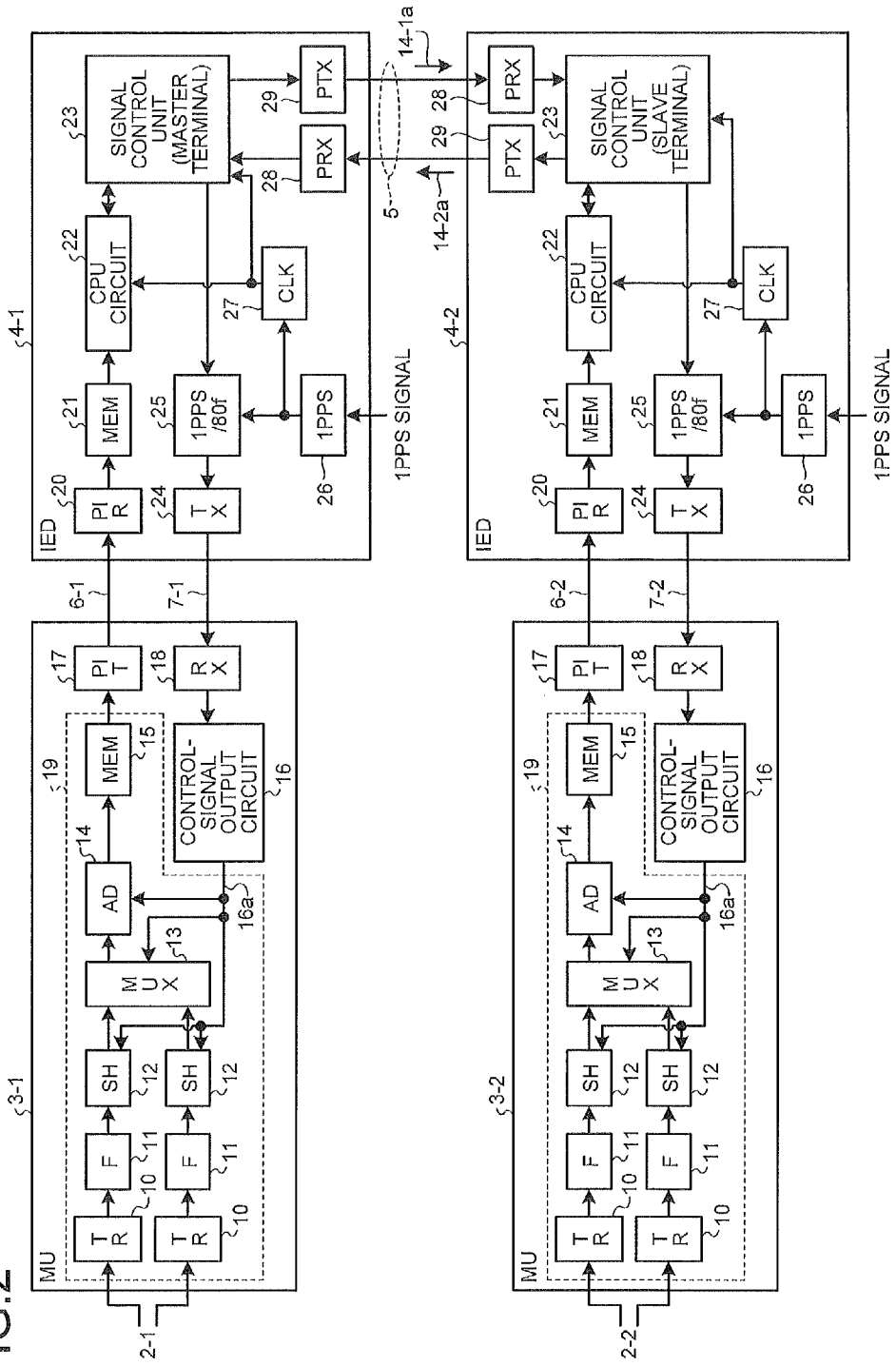
FIG. 2 is a block diagram of MUs and IEDs according to the first embodiment of the present invention.

FIG. 2 is a block diagram of the MUs 3 and the IEDs 4 according to the first embodiment of the present invention. Each of the MUs 3 is configured to include a data output unit 19, a control-signal output circuit 16, a process-bus transmission circuit (PIT) 17, which is a process-bus interface, and a sampling-timing control-signal reception circuit (RX) 18. The data output unit 19 is configured to include a plurality of input transformers (TR) 10, a plurality of filter circuits (F) 11, a plurality of sample and hold circuits (SH) 12, a multiplexer circuit (MUX) 13, an AD converter (AD) 14, and a memory circuit (MEM) 15.

An operation of the MU 3-1 is explained below. The CT secondary current detected by the CT 2-1 is converted by the input transformers 10 to a voltage signal suitable for an MU internal circuit. Noise harmonic components are removed from the converted voltage signal by each of the filter circuits 11, and this signal is then transmitted to each of the sample and hold circuits 12. The signals input to the sample and hold circuits 12 are controlled (held for a short time) according to a signal included in a control signal 16a from the control-signal output circuit 16 and are then transmitted to the multiplexer circuit 13, in order for the AD converter 14 to perform AD conversion. The signals input to the multiplexer circuit 13 are changed in order according to a signal included in the control signal 16a, and are then transmitted to the AD converter 14. The signals input to the AD converter 14 are converted from analog to digital data according to a sampling signal included in the control signal 16a, and then the converted current data is temporarily stored in the memory circuit 15. The current data stored in the memory circuit 15 is sequentially transmitted to the process-bus transmission circuit 17. In the process-bus transmission circuit 17, the current data is standardized according to the process-bus protocol defined in the IEC 61850 standards, and this standardized current data is transmitted to the IED 4-1 through the process bus 6-1.

The control-signal output circuit 16 captures a 1PPS signal or an 80f signal, which is a sampling-timing control signal from the IED 4-1, through the sampling-timing control-signal reception circuit 18. In the control-signal output circuit 16, the control signal 16a synchronized with the sampling-timing control signal is generated. The control-signal output circuit 16 is described later in detail.

The MU 3-2 has the same configuration as the MU 3-1 except that, for example, a CT secondary current detected by the CT 2-2 is input, a signal standardized in the process-bus transmission circuit 17 is transmitted to the IED 4-2 through the process bus 6-2, and the sampling-timing control signal from the IED 4-2 is captured into the control-signal output circuit 16. Therefore, explanations thereof will be omitted.

Each of the IEDs 4 is configured to include a process-bus reception circuit (PIR) 20, which is a process-bus interface, a memory circuit 21, a CPU circuit 22, the signal control unit 23, a sampling-timing control-signal transmission circuit (TX) 24, a 1PPS/80f-signal transmission circuit 25, a 1PPS-signal reception unit 26, a clock circuit 27, a PCM reception circuit (PRX) 28, which is a PCM interface, and a PCM transmission circuit (PTX) 29, which is a PCM interface.

An operation of the IED 4-1 is explained below. Data from the process-bus transmission circuit 17 is received by the process-bus reception circuit 20 and is then stored temporarily in the memory circuit 21. In the CPU circuit 22, relay computation is performed at the start timing of a divided signal obtained from an 80f signal in the own terminal (for example, 16f that is obtained by dividing 80f by five). The 80f signal is generated in the signal control unit 23 on the basis of the clock from the clock circuit (CLK) 27.

The signal control unit 23 captures the own-terminal data (for example, current data) from the CPU circuit 22. After a given time from the start of relay computation, the signal control unit 23 transmits the own-terminal data (14-1a) to the IED 4-2 in the counterpart terminal through the PCM transmission circuit 29 and the PCM transmission path 5. The signal control unit 23 receives the counterpart-terminal data (14-2a) through the PCM reception circuit 28. The received counterpart-terminal data is captured into the CPU circuit 22. In the CPU circuit 22, differential computation is performed using the counterpart-terminal data and the own-terminal data synchronized with the counterpart-terminal data.

The signal control unit 23 derives the synchronization deviation time between the sampling timings at both ends of the power transmission line by transmission-time measurement of the own-terminal data and the counterpart-terminal data by using their respective sampling signals. Further, the signal control unit 23 measures the sampling-synchronization control amount from this synchronization deviation time, controls the timing of transmitting an 80f signal to the MU 3 (corrects the cycle of the 80f signal), and transmits the controlled 80f signal to the 1PPS/80f-signal transmission circuit 25. The transmission-time measurement is a sampling-signal synchronization method for a PCM current differential relay that does not use a GPS time signal as a sampling-timing control signal. This method is publicly known, and therefore explanations thereof will be omitted.

When a GPS time signal is normally received in a GPS receiver (not shown), a time signal (a 1PPS signal) is generated in the GPS receiver, and then this 1PPS signal is received by the 1PPS-signal reception unit 26. The 1PPS signal received by the 1PPS-signal reception unit 26 is transmitted to the sampling-timing control-signal reception circuit 18 within the MU 3-1 through the 1PPS/80$f$-signal transmission circuit 25 and the sampling-timing control-signal transmission circuit 24. The 1PPS signal received by the 1PPS-signal reception unit 26 is input to the clock circuit 27. A clock synchronized with the cycle of the 1PPS signal is generated in the clock circuit 27. An 80$f$ signal synchronized with this clock is generated in the signal control unit 23.

In contrast, when a GPS time signal is lost or similar occurrences, an 80$f$ signal is generated in the signal control unit 23 by the clock in the clock circuit 27. This 80$f$ signal is then transmitted to the MU 3-1 as an output signal from the 1PPS/80$f$-signal transmission circuit 25. As described above, the IED 4-1 is set as a master terminal and the IED 4-2 is set as a slave terminal. Therefore, in the IED 4-1, the sampling control is executed by a signal synchronized with a clock in the own terminal, and in the IED 4-2, the sampling control is executed by a clock synchronized with a signal of transmission data (14-1$a$) from the counterpart terminal.

The IED 4-2 has the same configuration as the IED 4-1 except that, for example, the process bus 6-2 is connected to the process-bus reception circuit 20 and the sampling-timing control-signal cable 7-2 is connected to the sampling-timing control-signal transmission circuit 24. Therefore, explanations of the operation of the IED 4-2 will be omitted.

Figure 3:
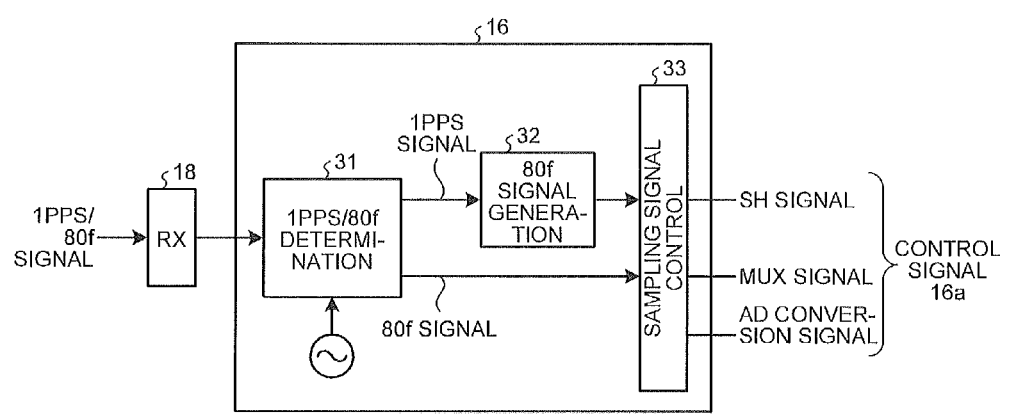
FIG. 3 is a block diagram of a control-signal output circuit within the MU according to the first embodiment of the present invention.

FIG. 3 is a block diagram of the control-signal output circuit 16 within the MU 3 according to the first embodiment of the present invention. The control-signal output circuit 16 is configured to include a signal determination unit 31, an 80$f$-signal generation unit 32, and a sampling-signal control unit 33.

The signal determination unit 31 receives a 1PPS signal or an 80$f$ signal through the sampling-timing control-signal reception circuit 18 to determine whether the received signal is a 1PPS signal or an 80$f$ signal. The 1PPS signal is a 1-pulse-per-second signal. When the frequency of the electric power system is 50 Hz, the 80$f$ signal has a frequency of 4000 Hz, which is higher than the frequency of the 1PPS signal. Therefore, it is possible for the signal determination unit 31 to easily discriminate between these signals.

When the signal received by the signal determination unit 31 is a 1PPS signal, this 1PPS signal is input to the 80$f$-signal generation unit 32. In the 80$f$-signal generation unit 32 to which the 1PPS signal has been input, an 80$f$ signal synchronized with the 1PPS signal is generated by a clock within the MU 3, for example. This 80$f$ signal is then input to the sampling-signal control unit 33. In contrast, when the signal received by the signal determination unit 31 is an 80$f$ signal, this 80$f$ signal is directly input to the sampling-signal control unit 33.

In the sampling-signal control unit 33, a sampling signal synchronized with the 80$f$ signal from the 80$f$-signal generation unit 32 or a sampling signal synchronized with the 80$f$ signal from the signal determination unit 31 is generated by an internal clock in the control-signal output circuit 16. This sampling signal is then output as the control signal 16$a$. The control signal 16$a$ includes a signal suitable for each of the sample and hold circuits 12, the multiplexer circuit 13, and the AD converter 14. For example, an SH signal is used for controlling the sample and hold circuits 12, an MUX signal is used for controlling the multiplexer circuit 13, and an AD conversion signal is used for controlling the AD converter 14.

Figure 4:
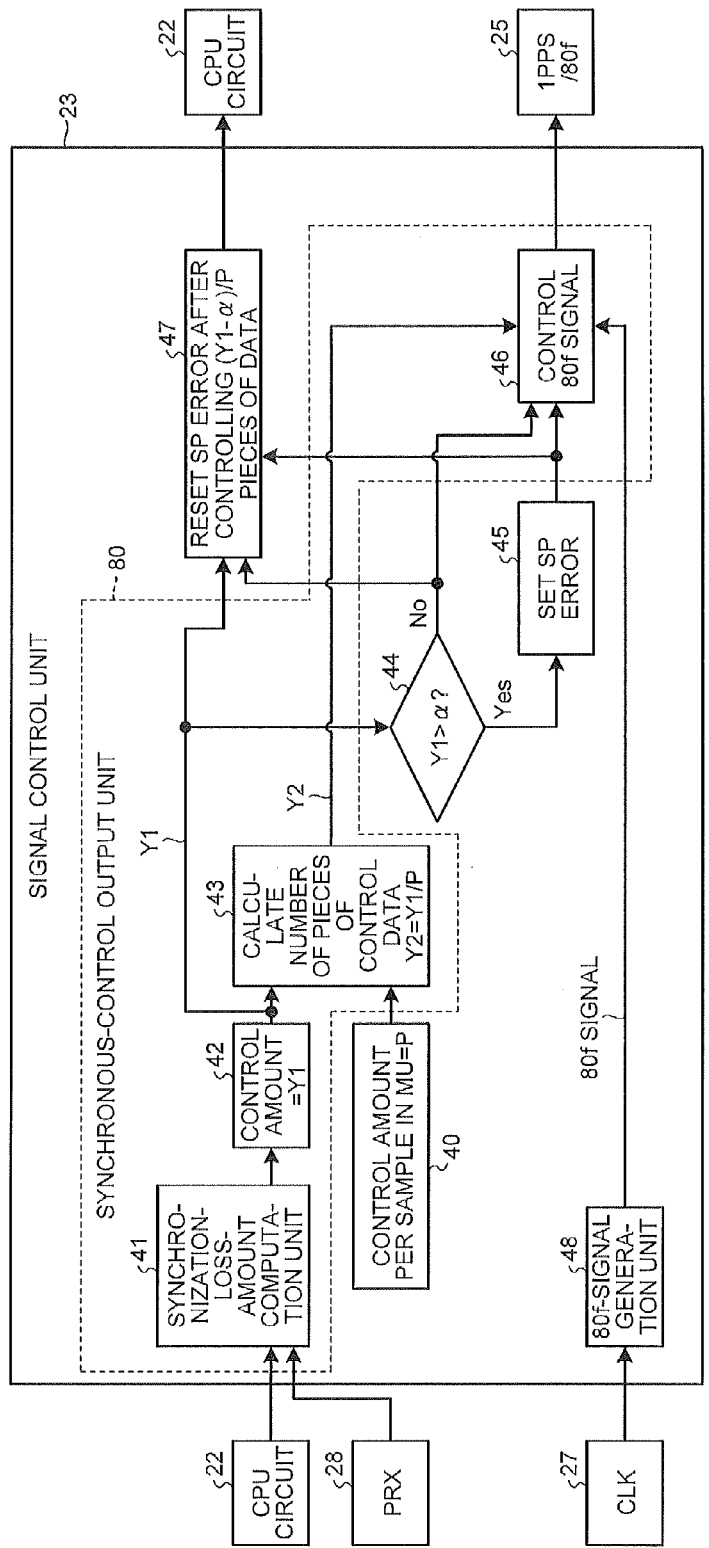
FIG. 4 is a block diagram for explaining synchronous control to be executed by a PCM control circuit within the IED according to the first embodiment of the present invention.

FIG. 4 is a block diagram for explaining synchronous control to be executed by the signal control unit 23 within the IED 4 according to the first embodiment of the present invention. The signal control unit 23 is configured to include a synchronous-control output unit 80, a control-amount setting unit 40, an 80$f$-signal generation unit 48, a sampling-error determination unit 44, a sampling (SP)-error setting unit 45, and an SP-error resetting unit 47. The synchronous-control output unit 80 is configured to include a synchronous control unit 41, a control-amount measurement unit 42, a number-of-pieces-of-control-data calculation unit 43, and a sampling-timing control-signal control unit 46.

For example, on the basis of the own-terminal data (the current data 14-1$a$) and the counterpart-terminal data (the current data 14-2$a$), the synchronous control unit 41 measures the synchronization deviation time between the sampling timings at both ends of the power transmission line. The control-amount measurement unit 42 measures the amount of synchronization loss (a sampling-timing control amount Y1) from this deviation time. A control amount P per sample (cycle) of an 80$f$ signal (a given value within a range that does not affect the relay computation cycle, that is for example, 200 nanoseconds (1/1250 of 250 milliseconds in the 80$f$-cycle)) in the sampling-signal control unit 33 within the MU 3 is set in the control-amount setting unit 40.

In the number-of-pieces-of-control-data calculation unit 43, the control amount Y1 from the control-amount measurement unit 42 is divided by the control amount P to derive the number of pieces of data Y2 required for the control in the MU 3. As described above, the control amount is set equal to the control amount per sample to be executed in the MU 3. Therefore, by controlling a sampling signal (an 80$f$ signal) by the control amount P, it becomes possible to execute the control that is equivalent to the synchronous control of the sampling timing of AD conversion in each of the MUs 3.

In the sampling-error determination unit 44, a determination value α is set as a fixed value in advance (for example, several tens of milliseconds) to determine that there is an error when the control amount Y1 exceeds the amount of synchronization loss caused in the normal synchronous control. The sampling-error determination unit 44 determines whether the control amount Y1 exceeds the determination value α. When the control amount Y1 is smaller than the determination value α, the sampling-timing control-signal control unit 46 controls (corrects) the cycle of an 80$f$ signal from the 80$f$-signal generation unit 48 by the control amount P-time for the number of pieces of data Y2. For example, when the control amount Y1 is 25 milliseconds and the control amount P is 200 nanoseconds, the sampling-timing control-signal control unit 46 controls the sampling cycle for the number of pieces of data Y2 (Y2=25/0.2=125 pieces) among 4000 samples (for example, data with the data number from 0 to 124) to 250.2 milliseconds or 249.8 milliseconds, and thereafter to 250 milliseconds. As described above, the sampling-timing control-signal control unit 46 controls the control amount Y1 (25 milliseconds) in such a manner as to cancel the control amount Y1. For example, the data number is the number assigned to current (voltage) data sampled by an 80$f$ signal within the MU 3 (for example, an 80$f$ signal generated in the 80$f$-signal generation unit 32), which is synchronized with a sampling-timing control signal from the IED 4 (an 80$f$ signal in the first embodiment). For example, the data number is the number incremented by one each time current (voltage) data is sampled (for example, 0 to 3999) and is assigned to the sampled data in the memory circuit 15 in the MU 3.

When the control amount Y1 exceeds the determination value α, the SP-error setting unit 45 determines that there is an SP error, and the SP error is set in the sampling-timing control-signal control unit 46 and the SP-error resetting unit 47. The sampling-timing control-signal control unit 46 in which the SP error has been set controls the cycle of an 80*f* signal from the 80*f*-signal generation unit by the control amount P-time for the number of pieces of data Y2.

In the SP-error resetting unit 47 in which the SP error has been set, the control amount Y1 measured by the control-amount measurement unit 42, the control amount P set in the control-amount setting unit 40, and the determination value α set in the sampling-error determination unit 44 are used to perform computation expressed by "(Y1−α)/P". The SP error is reset after the control is executed for this number of pieces of data (Y1−α)/P. For example, when the control amount Y1 is 45 milliseconds, the control amount P is 200 nanoseconds, and the determination value α is 30 milliseconds, the SP-error resetting unit 47 controls the sampling cycle for (Y1−α)/P pieces of data among 4000 samples, that is, (45−30)/0.2=75 pieces of data (for example, data with the data number from 0 to 74), and thereafter resets the SP error. That is, the period from setting an SP error in the SP-error setting unit 45 to resetting the SP error indicates that the sampling synchronization deviates by the determination value α or larger, and therefore the SP error is continued. In order to prevent the current differential relay according to the first embodiment from a malfunction within a period during which sampling synchronization of an 80*f* signal is not maintained, the current differential relay is configured, for example, to stop current-differential computation in the CPU circuit 22 or to lock a current-differential-computation output of the CPU circuit 22 within a period during which the sampling synchronization deviates by the determination value α or larger. Examples of the malfunction include unnecessarily operating the breaker by the IED 4 in response to the result of the current differential relay computation performed by the CPU circuit 22.

Next, an operation is explained. When the IED 4 normally receives a 1PPS signal from the GPS receiver, the 1PPS signal is transmitted to each of the MUs 3. Each of the MUs 3 executes the sampling control on the basis of this 1PPS signal. In the clock circuit 27, a clock synchronized with this 1PPS signal is generated. In the signal control unit 23, an 80*f* signal is generated by this clock. In the CPU circuit 22 and the signal control unit 23, the start of relay computation and the start of current-data transmission to the counterpart terminal are controlled by this 80*f* signal, for example. Because the cycles of the 1PPS signal are highly accurate and substantially consistent, synchronization of the above 80*f* signal can also be maintained with high accuracy.

When a GPS time signal is lost or similar occurrences in one of the IEDs 4 provided at both ends of the power transmission line (for example, in the IED 4-1), regardless of whether the IED 4-1 is set as a master terminal or a slave terminal, an 80*f* signal is generated in the IED 4-1 at the timing synchronized with the data from the IED 4-2 that normally receives a 1PPS signal. This 80*f* signal is then transmitted to the MU 3-1 instead of a 1PPS signal. The MU 3-1 performs sampling on the basis of this 80*f* signal.

When a GPS time signal is lost or similar occurrences in both the IEDs 4 provided at both ends of the power transmission line, the IED 4-2 generates an 80*f* signal at the timing synchronized with the data received from the IED 4-1 and transmits this 80*f* signal to the MU 3-2 according to the master-terminal setting and the slave-terminal setting in the signal control unit 23. The MU 3-2 performs sampling on the basis of this 80*f* signal. The IED 4-1 transmits an 80*f* signal generated by the own-terminal clock to the MU 3-1. The MU 3-1 performs sampling on the basis of this 80*f* signal.

In the master terminal, it is not necessary to control the sampling timing using data from the slave terminal. Therefore, there is no functional problem when a 1PPS signal is generated from an 80*f* signal generated by the own-terminal clock and then this 1PPS signal is transmitted to the MU 3-1 to control sampling in the MU 3-1. However, in the slave terminal, while synchronizing an 80*f* signal in the own terminal with the sampling timing in the master terminal, it is necessary to constantly correct a clock cycle deviation between the IED 4-1 and the IED 4-2 (an error caused by an individual difference between crystal oscillators, that is, normally several tens of milliseconds per second). Therefore, the slave terminal needs an 80*f* signal to control the sampling timing in real time. This is because there is a possibility for a 1PPS signal to cause a synchronization error of several tens of milliseconds due to a clock deviation. That is, at least a terminal, required to synchronize with the sampling timing in the counterpart terminal by transferring data with the counterpart terminal, is configured to execute the sampling control in the MU 3 on the basis of an 80*f* signal.

A 1PPS signal that serves as a signal that controls the sampling timing is a 1-pulse-per-second signal. Therefore, when the sampling control is executed on the basis of the 1PPS signal, the current differential relay has no option but to detect synchronization loss in each 1PPS signal and control the duration to the next 1PPS signal by the amount of this synchronization loss. Accordingly, until the duration-controlled 1PPS signal is transmitted to the MU 3, the sampling timing cannot be controlled in the MU 3. In contrast, in the case of using an 80*f* signal, because the sampling-timing control can be executed in real time, it is advantageous that a clock deviation is almost negligible for the frequency of 80*f*.

In the first embodiment, an 80*f* signal is used as a sampling-timing control signal when a GPS time signal is lost or similar occurrences. However, the sampling-timing control signal is not limited to the 80*f* signal. Almost the same effects can be obtained even if the control is performed with a cycle shorter than one second (for example, the control at the system frequency or the control every 10 milliseconds).

As explained above, the current differential relay according to the first embodiment is a current differential relay, where the current differential relay is provided in plural, and the current differential relays are provided at both ends of a protected segment and transmit and receive digital data regarding an electrical input to the relays to and from each other. Each of the current differential relays, which are provided at both ends of a protected segment, includes a merging unit (the MU 3-1 or 3-2) that merges an electrical input detected in its own terminal, samples the electrical input, converts the electrical input to digital data, and outputs the digital data, and a computation unit (the IED 4-1 or 4-2) that is located apart from the merging unit, is connected to the merging unit through a data communication bus (the process bus 6-1 or 6-2), and performs differential computation using digital data from the merging unit in its own terminal and digital data from the merging unit in the other terminal, which is transmitted from the computation unit in the other terminal through a PCM transmission line. Each of the computation units includes the signal control unit 23 that derives a time difference (the control amount Y1) in sampling timing between a sampling-timing control signal from the computation unit to the merging unit in its own terminal and a sampling-timing control signal from the computation unit to the merging unit in the other terminal, on the basis of digital data in its own terminal and digital data in the other terminal, that controls a cycle of a sampling-timing control signal (an 80f signal and a 1PPS signal) on the basis of this time difference, and that outputs this controlled sampling-timing control signal to the merging unit in its own terminal, and a signal transmission unit (the 1PPS/80f-signal transmission circuit 25) that, when a time-signal reception unit (the 1PPS-signal reception unit 26), which receives a GPS time signal, normally receives the GPS time signal, transmits a 1PPS signal from the time-signal reception unit to the merging unit in its own terminal as the sampling-timing control signal, and that, when the time-signal reception unit does not normally receive the GPS time signal, transmits an 80f signal from the signal control unit 23 to the merging unit in its own terminal as the sampling-timing control signal. Each of the merging units includes the control-signal output circuit 16 that generates a sampling signal synchronized with the sampling-timing control signal and that outputs this sampling signal as the control signal 16a, and the data output unit 19 that converts the electric quantity to digital data and outputs the digital data on the basis of the control signal 16a from the control-signal output circuit 16. Therefore, the sampling-timing control signal controlled by the IED 4 is transmitted to the MU 3 and it is possible for the MU 3 to perform AD conversion on the basis of a sampling signal synchronized with this sampling-timing control signal. Accordingly, it is possible to correctly maintain sampling synchronization without being affected by fluctuations in the data-communication time on the process bus from the MU to the IED. Further, when a 1PPS signal is normally received from the GPS receiver, the sampling-synchronization control in the MU 3 is executed by the 1PPS signal. When a GPS time signal is lost or similar occurrences, in a terminal that needs to be synchronized with a sampling-timing control signal in the counterpart terminal, the sampling control in the MU 3 is executed by an 80f signal on which the sampling control has been executed so as to be synchronized with data from the counterpart terminal. With this configuration, in the current differential relay according to the first embodiment, it is possible to execute the sampling-synchronization control in real time without any time delay even when a GPS time signal is lost or similar occurrences.

Further, in the current differential relay according to the first embodiment, the signal control unit 23 includes the control-amount setting unit 40 that sets the synchronization control amount P per sample of a sampling signal, and the synchronous-control output unit 80 that measures the synchronization deviation time difference (the control amount Y1) and that controls the cycles of the sampling-timing control signal on the basis of this control amount Y1 and the synchronization control amount P. Therefore, it is possible for the IED 4 to execute the control that is the same as the sampling control in the MU 3 on the sampling-timing control signal (the 80f signal) in the IED 4. Accordingly, in the IED 4, the start timing of relay computation and the start timing of data transmission to the counterpart terminal can be synchronized with the sampling timing in the MU 3. As a result, sampling synchronization at both ends of the power transmission line can be maintained by the PCM synchronous control that is the same as the conventional control.

Furthermore, in the current differential relay according to the first embodiment, each of the IEDs 4 includes a computation circuit that performs differential computation (the CPU circuit 22), and the signal control unit 23 is configured to stop the current differential computation in the CPU circuit 22 or lock the computation output of the CPU circuit 22 when the control amount Y1 exceeds the predetermined determination value α, and is configured to cancel the stop of computation in the CPU circuit 22 or unlock the computation output of the CPU circuit 22 when the control amount Y1 is smaller than the determination value α. Therefore, the IED 4 can recognize the synchronization-loss time on the basis of the control amount Y1, and when synchronization loss has occurred, the IED 4 can perform a process such as locking an error output due to a differential current caused by a synchronization deviation between the sampling timings at both ends.

Second Embodiment.

According to the first embodiment, when a GPS time signal is lost or similar occurrences, a terminal (a slave terminal) that needs to be synchronized with a sampling-timing control signal in the counterpart terminal is configured to perform sampling in the MU 3 on the basis of a synchronously-controlled 80f signal. According to a second embodiment, for example, in a system that does not use a GPS time signal, on the basis of a 1PPS signal subsequent to the point in time when the sampling control is required (or the received-data number from the MU 3 at the point in time when the sampling control is required) and on the basis of the sampling-synchronization control amount Y1, the number of pieces of data Y2 required to complete the sampling control in the MU 3 is calculated, and the cycles of the 1PPS signal to be transmitted to the MU 3 are controlled to maintain sampling synchronization in the MU 3. In the second embodiment, elements identical to those of the first embodiment are denoted by like reference signs and detailed explanations thereof will be omitted.

Figure 5:
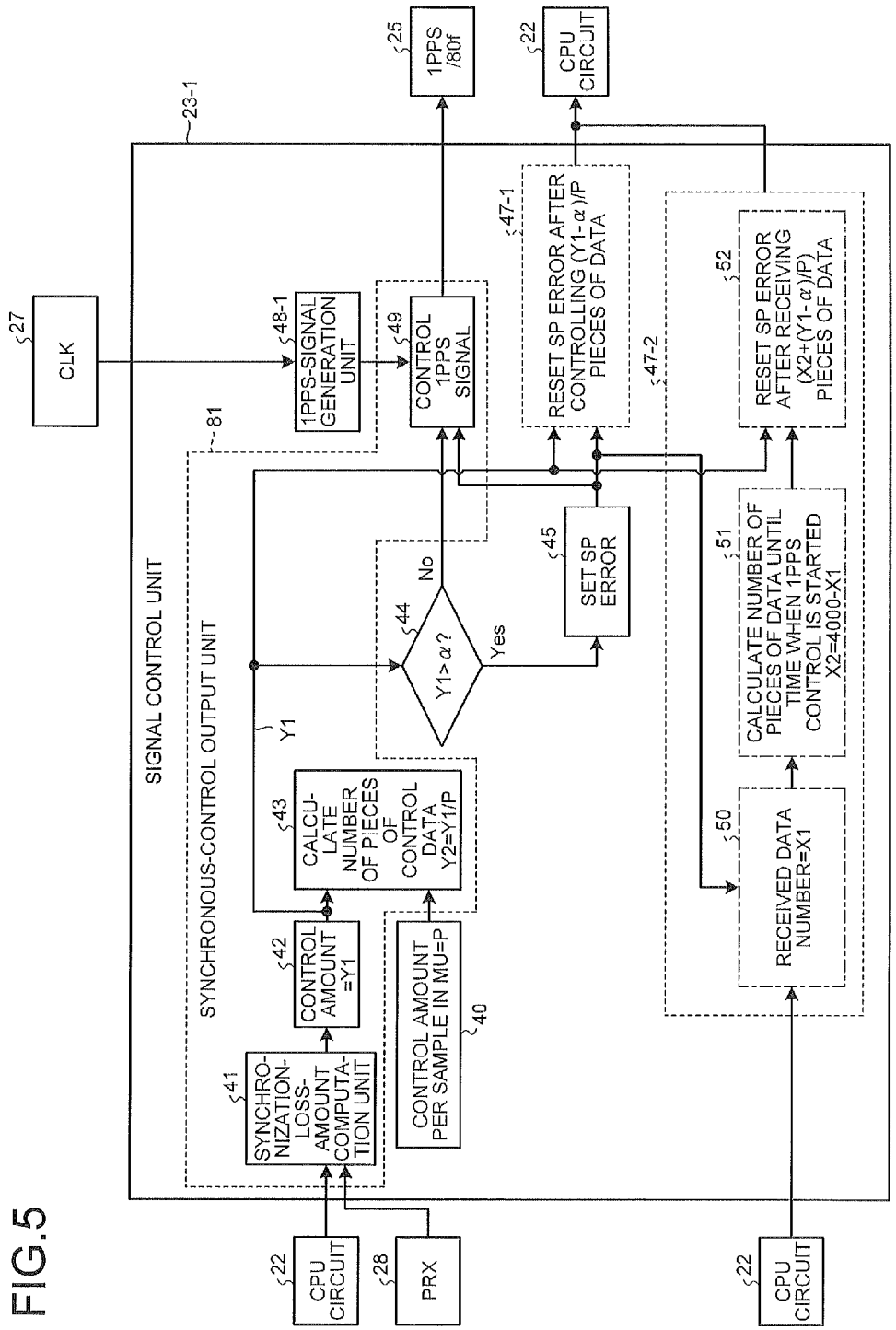
FIG. 5 is a block diagram for explaining synchronous control to be executed by a PCM control circuit within an IED according to the second embodiment of the present invention.

FIG. 5 is a block diagram for explaining synchronous control to be executed by a signal control unit 23-1 within the IED 4 according to the second embodiment of the present invention. The signal control unit 23-1 is configured to include a synchronous-control output unit 81, a 1PPS-signal generation unit 48-1, the control-amount setting unit 40, the sampling-error determination unit 44, the sampling (SP)-error setting unit 45, and an SP-error resetting unit (a first SP-error resetting unit 47-1 or a second SP-error resetting unit 47-2). The synchronous-control output unit 81 is configured to include the synchronous control unit 41, the control-amount measurement unit 42, the number-of-pieces-of-control-data calculation unit 43, and a sampling-timing control-signal control unit 49.

Differences from the signal control unit 23 in the first embodiment are that the 1PPS-signal generation unit 48-1 is provided instead of the 80f-signal generation unit 48, the sampling-timing control-signal control unit 49 is provided instead of the sampling-timing control-signal control unit 46, and the first SP-error resetting unit 47-1 or the second SP-error resetting unit 47-2 is provided instead of the SP-error resetting unit 47.

Next, an operation is explained. Operations from the control-amount setting unit 40 to the number-of-pieces-of-control-data calculation unit 43 are the same as those in the first embodiment, and therefore explanations thereof will be omitted. The sampling-error determination unit 44 determines whether the control amount Y1 exceeds the determination value α. When the control amount Y1 is smaller than the determination value α, the sampling-timing control-signal control unit 49 controls (corrects) the cycles of a 1PPS signal from the 1PPS-signal generation unit 48-1 by the control amount Y1.

When the control amount Y1 exceeds the determination value α, the SP-error setting unit 45 determines that there is an SP error, and the SP error is set in the sampling-timing control-signal control unit 49 and the SP-error resetting unit (47-1 or 47-2). After the SP error is set, the sampling-timing control-signal control unit 49 controls the cycles of the 1PPS signal by the control amount Y1 in the same manner as described above.

In the first SP-error resetting unit 47-1 in which the SP error has been set, the control amount Y1 measured by the control-amount measurement unit 42, the control amount P set in the control-amount setting unit 40, and the determination value α set in the sampling-error determination unit 44 are used to perform computation expressed by "(Y1−α)/P". The SP error is reset after (Y1−α)/P number of 80$f$ sampling cycles is controlled. That is, the period from setting an SP error in the SP-error setting unit 45 to resetting the SP error in the first SP-error resetting unit 47-1 indicates that the sampling synchronization deviates by the determination value α or larger, and therefore the SP error is continued. As described above, the current differential relay according to the second embodiment stops current-differential computation in the CPU circuit 22 or locks the computation output of the CPU circuit 22 within a period during which sampling synchronization deviates by the determination value α or larger, so as to prevent the current differential relay from a malfunction within a period during which sampling synchronization of a 1PPS signal is not maintained.

For additional details regarding the timing of resetting an SP error, the SP error is reset at the timing after the number of samples reaches (Y1−α)/P in the first embodiment. On the other hand, in the case of controlling a 1PPS signal as described in the second embodiment, the SP error is reset at the timing at which the number of pieces of data received by the IED 4 after a 1PPS signal (for example, the signal represented by the symbol "a" in FIG. 8 described later) generated after detecting the SP error is transmitted to the MU 3 reaches (Y1−α)/P. To explain this, because the 1PPS signal is a 1-pulse-per-second signal, the MU 3 cannot recognize a duration-controlled 1PPS signal unless the MU 3 has already received a 1PPS signal having been controlled by the control amount Y1 (for example, the signal represented by the symbol "c" in FIG. 8). Meanwhile, in the MU3, an 80$f$ signal generated after receiving this 1PPS signal is controlled (the cycles of the 80$f$ signal are controlled by allotting the control amount P per sample of the 80$f$ signal). Therefore, (Y1−α)/P pieces of sample data are transmitted to the IED 4 by the time when the control amount Y1 is controlled so as to become smaller than the determination value α. Accordingly, the SP error is reset at the timing at which the number of pieces of data received by the IED 4 reaches (Y1−α)/P.

Instead of the above method, the signal control unit 23-1 can use the second SP-error resetting unit 47-2. The second SP-error resetting unit 47-2 is configured to include a received-data-number reading unit 50, a number-of-pieces-of-data calculation unit 51, and an SP-error resetting unit 52.

When an SP error from the SP-error setting unit 45 is set, the received-data-number reading unit 50 reads a data number X1 assigned to the data received at this point in time. This data number X1 ranges from 0 to 3999 described above.

The number-of-pieces-of-data calculation unit 51 calculates the number of pieces of data received from the point in time when the received-data-number reading unit 50 reads the data number X1 to the point in time when the next 1PPS signal (for example, the signal represented by the symbol "a" in FIG. 8) is output. That is, in the number-of-pieces-of-data calculation unit 51, the number of pieces of received data X2 from the point in time when an SP error is set to the point in time when the next 1PPS signal is output is derived by computation expressed by "4000-X1".

The SP-error resetting unit 52 uses the number of pieces of data from the number-of-pieces-of-data calculation unit 51, the control amount Y1 from the control-amount measurement unit 42, and the control amount P from the control-amount setting unit 40 to perform computation expressed by (X2+(Y1−α)/P). After receiving (X2+(Y1−α)/P) pieces of data after setting the SP error, the SP-error resetting unit 52 resets the SP error. That is, while the number of pieces of data required for the MU 3 is Y2, the control amount Y1 is determined as an SP error when it becomes a value equal to or larger than α. Therefore, the IED 4 can reset the SP error at the time when (Y1−α)/P pieces of data are received. Further, at the time when (X2+(Y1−α)/P) pieces of data are received, a synchronization deviation in the MU 3 is considered to be smaller than α, and therefore the IED 4 can reset the SP error.

As explained above, in the current differential relay according to the second embodiment, the signal control unit 23-1 sets the synchronization control amount P per sample of a sampling signal, stops computation in a computation circuit (the CPU circuit 22) or locks the computation output of the computation circuit when the time difference (the control amount Y1) exceeds the predetermined determination value α, and cancels the stop of computation in the computation circuit or unlocks the computation output of the computation circuit when the time difference (the control amount Y1) becomes smaller than the determination value α, and the MU 3 is configured to include the control-signal output circuit 16 that generates a sampling signal synchronized with the sampling-timing control signal and that outputs this sampling signal as the control signal 16$a$, and the data output unit 19 that converts the electric quantity to digital data and outputs the digital data on the basis of the control signal 16$a$ from the control-signal output circuit 16. Therefore, the IED 4 can execute the control that is the same as the sampling control in the MU 3 on a sampling-timing control signal (an 80$f$ signal) within the IED 4. The MU 3 can receive the sampling-timing control signal from the IED 4 and use a given control amount in the 80$f$ signal according to the measured control amount to control the required number of pieces of data. Accordingly, regardless of whether a GPS signal is present, it is possible to correctly maintain sampling synchronization without being affected by fluctuations in the data-communication time on the process bus from the MU 3 to the IED 4. Further, in the IED 4, the start timing of relay computation and the start timing of data transmission to the counterpart terminal can be synchronized with the sampling timing in the MU 3. Also, a process can be performed such as locking an error output due to a differential current caused by a synchronization deviation between the sampling timings at both ends.

In the current differential relay according to the second embodiment, a 1PPS signal is used as a sampling-timing control signal, the control-signal output circuit 16 generates the number to be incremented cyclically each time a sampling signal is generated, the data output unit 19 assigns the number generated in the control-signal output circuit 16 to digital data, and the signal control unit 23 counts the number of digital data received during a period from the point in time when the control amount Y1 exceeds the determination value α to the point in time when the next 1PPS signal is output, in order to derive the number of pieces of data (X2) received during this period and stops current-differential computation in the CPU circuit 22 during a period up until the number of pieces of data, received after the control amount Y1 exceeds the determination value α, reaches (X2+(Y1−α)/P). Therefore, the 1PPS/80f-signal determination unit 31 in the MU 3 is omitted and accordingly the sampling timing cannot be corrected in real time as compared to the first embodiment in which the sampling timing is corrected using an 80f signal. However, the current differential relay according to the second embodiment is still applicable because it does not provide any error output.

Third Embodiment.

The current differential relay according to the second embodiment is configured to estimate the control in the MU 3 and calculate the timing at which a sampling synchronization deviation (the control amount Y1) in each of the IEDs 4 becomes smaller than the determination value α in order to reset an SP error. In a third embodiment, a determination unit, which determines whether a control amount Y1M for the duration of a 1PPS signal received in the MU 3 exceeds a determination control amount α, is provided in the MU 3. When the control amount Y1M exceeds the determination value α, an SP-error flag is set in transmission data and transmitted to the IED 4 until the control amount Y1M becomes smaller than the determination value α. In the third embodiment, elements identical to those of the first and second embodiments are denoted by like reference signs and detailed explanations thereof will be omitted.

Figure 6:
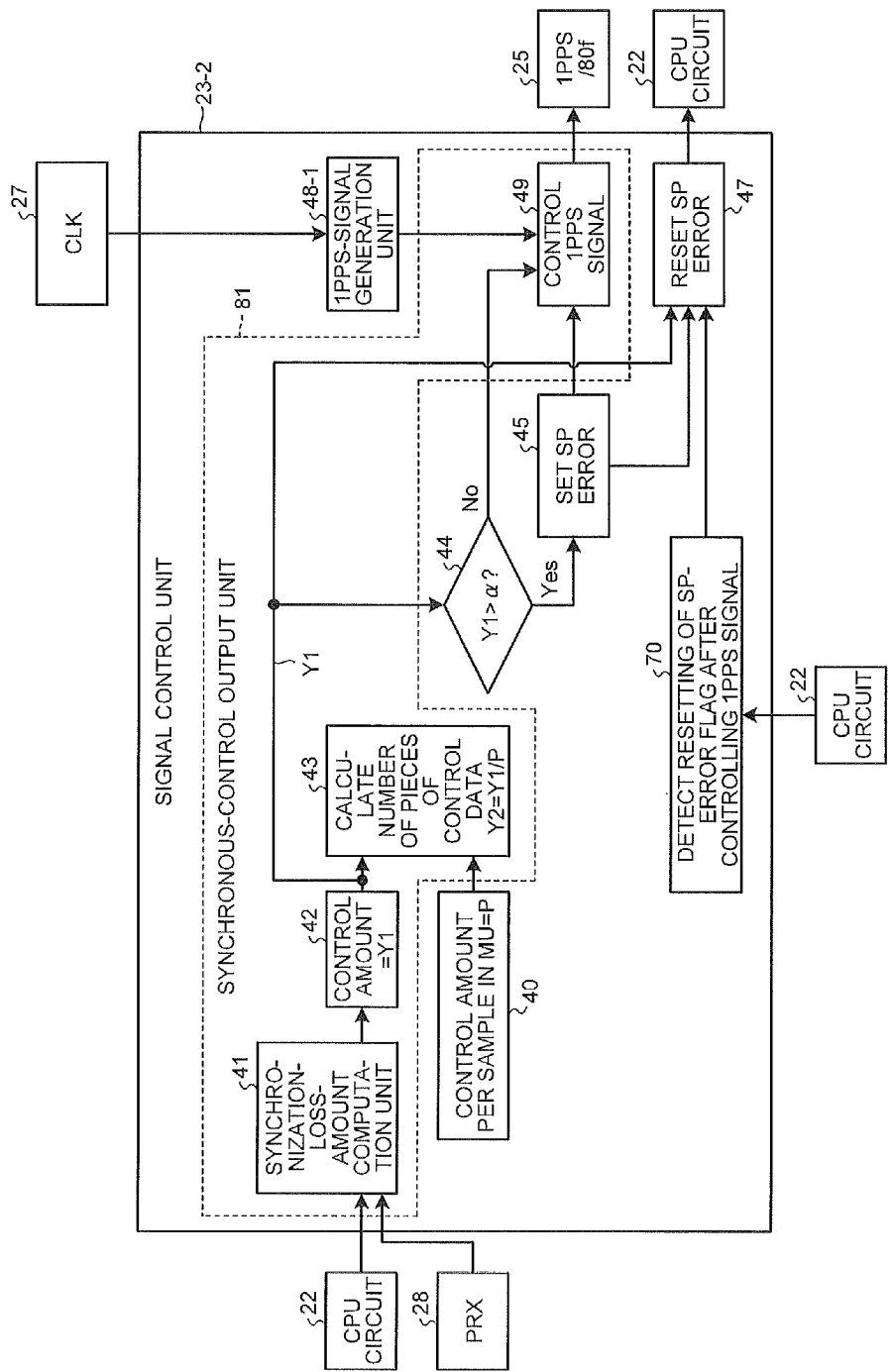
FIG. 6 is a block diagram for explaining synchronous control to be executed by a PCM control circuit within an IED according to the third embodiment of the present invention.

FIG. 6 is a block diagram for explaining synchronous control to be executed by a signal control unit 23-2 within the IED 4 according to the third embodiment of the present invention. The signal control unit 23-2 is configured to include the synchronous-control output unit 81, the sampling-error determination unit 44, the SP-error setting unit 45, the SP-error resetting unit 47, and a flag-reset detection unit 70. A difference from the signal control unit 23-1 according to the second embodiment is that the flag-reset detection unit 70 is provided.

Figure 7:
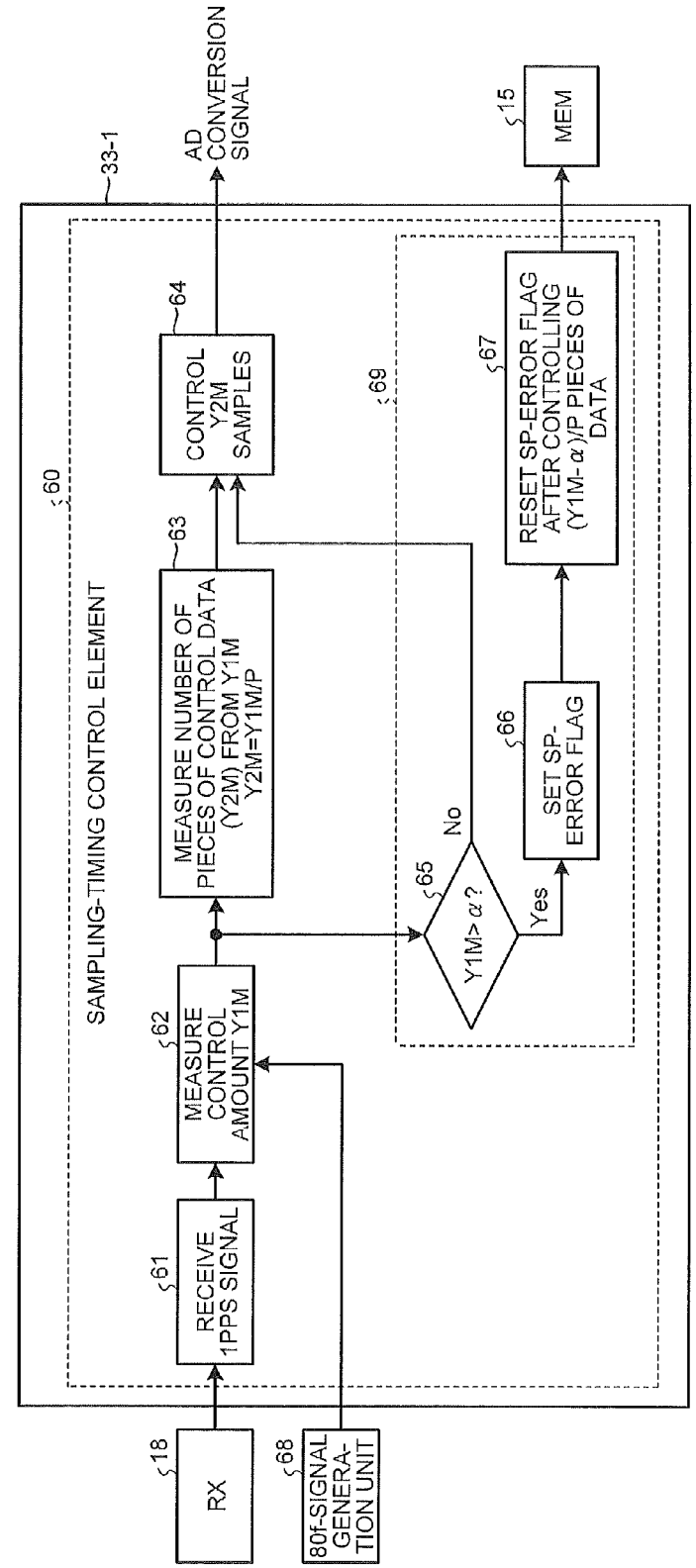
FIG. 7 is a configuration diagram of a sampling-signal control unit within an MU according to the third embodiment of the present invention.

FIG. 7 is a configuration diagram of a sampling-signal control unit 33-1 within the MU 3 according to the third embodiment of the present invention. The sampling-signal control unit 33-1 includes a sampling-timing control element 60 for generating an AD conversion signal, for example. The sampling-timing control element 60 includes a 1PPS-signal reception unit 61, a control-amount measurement unit 62, a number-of-pieces-of-control-data calculation unit 63, a sampling-signal control unit 64, and a flag setting unit 69. The flag setting unit 69 is configured to include a sampling-error determination unit 65, an SP-error flag setting unit 66, and an SP-error flag resetting unit 67.

In the sampling-error determination unit 65, a value is set that is the same as the determination value α set in the IED 4 in the first and second embodiments. With such a configuration, an SP error is set in the IED 4, the next 1PPS signal (the 1PPS signal represented by the symbol "a" in FIG. 8) is output from the IED 4, and the MU 3 determines whether the control amount Y1M exceeds the determination value α. When the control amount Y1 exceeds the determination value α, the IED 4 detects an SP-error flag assigned to data received from the MU 3. At the time when the control amount Y1 becomes smaller than the determination value α, the IED 4 no longer detects this SP-error flag.

Next, an operation is explained. In the sampling-timing control-signal control unit 49 in the signal control unit 23-2, the time up to the next 1PPS signal is controlled by the control amount Y1, and this 1PPS signal is transmitted to the MU 3 through the 1PPS/80f-signal transmission circuit 25. The 1PPS-signal reception unit 61 in the MU 3 receives the 1PPS signal from the IED 4. The control-amount measurement unit 62 derives the time difference between the sampling timing of an 80f signal immediately before receiving the 1PPS signal and the timing of receiving the 1PPS signal, and measures the control amount Y1M on the basis of this time difference. In the number-of-pieces-of-control-data calculation unit 63, the control amount Y1M is divided by the control amount P in the MU 3 to derive the number of pieces of data Y2M required for the control in the MU 3.

When the control amount Y1M is smaller than the determination value α, in the sampling-signal control unit 64, the cycle of the 80f signal is controlled by the control amount P for Y2 M.

When the control amount Y1M exceeds the determination value α, the SP-error flag setting unit 66 determines that there is an SP error and sets an SP-error flag in the memory circuit 15 in the data output unit 19 (see FIG. 2), for example. The sampling-signal control unit 64 controls the cycle of the 80f signal by the control amount P for Y2M.

When the SP error has been set, the SP-error flag resetting unit 67 uses the control amount Y1 M, the control amount P, and the determination value α to perform computation expressed by "(Y1M−α)/P", and then resets the SP-error flag after controlling (Y1M−α)/P number of cycles of the 80f signal. That is, the SP-error flag remains until the control amount Y1M becomes equal to or smaller than α. The sampling-signal control unit 64 controls the sampling timing until the control for the number of pieces of data Y2M is completed. The output of the sampling-signal control unit 64 is input to the AD converter 14 as an AD conversion signal (the control signal 16a), for example. The current data 14-1a and 14-2a, having been converted by the AD converter 14, is transmitted to the IED 4.

The IED 4 receives the data sampled by the 80f signal within the MU 3. When the SP-error flag assigned to this data has been reset, the flag-reset detection unit 70 within the signal control unit 23-2 notifies the SP-error resetting unit 47 of the fact that the SP-error flag has been reset. The SP-error resetting unit 47 resets the SP error. That is, during the period from setting an SP error to resetting the SP error, the SP error is continued, which indicates that sampling synchronization deviates by the determination value α or larger. Therefore, in the third embodiment, in order to prevent a malfunction within a period during which the sampling synchronization is not maintained, a required process is performed on the result of the current differential relay computation performed in the CPU circuit 22 in the same manner as in the first or second embodiment.

FIG. 8 is an explanatory diagram of an operation of the current differential relay according to the third embodiment of the present invention. The operation of the current differential relay is specifically explained using the symbols shown in FIG. 8. (A1) A1 shows the timing of an 80f signal generated from a 1PPS signal within the IED 4. The current differential relay according to the third embodiment is configured such that an 80f signal generated in the MU 3 is synchronized with the 80f signal in the IED 4. (A2) The signal control unit 23-3 in the IED 4 transmits and receives a PCM signal to and from the counterpart terminal to execute the synchronous control. A2 shows the timing of an "SP error", at which the synchronization control amount Y1 derived from the result of the synchronous control exceeds the determination value α and the timing of an "SP-error reset", at which the "SP error" is reset. (A3) A3 shows the timing of a 1PPS signal transmitted from the IED 4 to the MU 3. The dotted arrow indicates the timing of a 1PPS signal before being controlled. The solid arrow indicates the timing of a 1PPS signal after being controlled. (B1) B1 shows the timing of a sampling signal within the MU 3. (B2) B2 shows the timing of transmitting data from the MU 3 to the IED 4.

(1) When the MU 3 receives the 1PPS signal represented by the symbol "a", the MU 3 derives the time difference between the timing of an 80f signal immediately before receiving this 1PPS signal and the timing of receiving this 1PPS signal as the control amount Y1M. (2) In the MU 3, the number of pieces of data Y2M, required for the control in the MU 3, is derived by computation expressed by "Y2M=Y1 M/P". The unit of control of an 80f signal is represented as P and the cycle of the 80f signal is controlled by P-time for Y2 M. As a result, a sampling signal in the MU 3, represented by the symbol "b", is synchronized with the timing of the 80f signal in the IED 4. The 1PPS signal represented by the symbol "c" is synchronized with the timing of a sampling signal in the MU 3. (3) Upon receiving the 1PPS signal, when the control amount Y1M exceeds the determination value α, an SP-error flag is set in the MU 3. (4) The cycle of the 80f signal is controlled by P-time, and when the remaining control amount becomes equal to or smaller than α, the SP-error flag is reset in the MU 3. (5) When the SP-error flag is reset, the SP error is reset in the IED 4. With such a configuration, the SP error in the IED 4 can be reset by using the result of the sampling control in the MU 3; therefore, the error can be reset in accordance with the actual sampling control in the MU 3. Thus, the IED 4 can confirm that synchronization of the actual sampling timings in the MU 3 falls within a given range.

(6) In the third embodiment, the SP-error determination according to the second embodiment can be used in combination. That is, by comparing the output of the second SP-error resetting unit 47-2 according to the second embodiment with the output of the flag-reset detecting unit 70, it is possible to determine whether the control in the MU is accurately simulated in the IED 4.

As explained above, in the third embodiment, the MU 3 includes the control-signal output circuit 16 that generates a sampling signal synchronized with the sampling-timing control signal and outputs this sampling signal as the control signal 16a, and the data output unit 19 that converts the electric quantity to digital data outputs the digital data on the basis of the control signal 16a from the control-signal output circuit 16. The control-signal output circuit 16 includes a measurement unit (the control-amount measurement unit 62) that measures the time difference (the control amount Y1M) between the sampling timing of a sampling-timing control signal (the signal represented by the symbol "a") and the timing of a sampling signal (an 80f signal) within the MU 3, which can be estimated from this sampling timing, the sampling-signal control unit 64 that controls the cycles of the sampling signal on the basis of the control amount Y1M and the synchronization control amount P per sample of the sampling signal and that synchronizes the timing of this sampling signal with the sampling-timing control signal, and the flag setting unit 69 that sets a flag, indicating a sampling-cycle error in the sampling signal, in the data output unit 19 when the control amount Y1M exceeds the predetermined determination value α and that cancels the flag setting when the control amount Y1M becomes smaller than the determination value α. The signal control unit 23-2 is configured to stop current differential computation in the CPU circuit 22 or lock the computation output of the CPU circuit 22 when the flag is set in digital data and is configured to cancel the stop of current differential computation in the CPU circuit 22 or unlock the computation output of the CPU circuit 22 when the flag is not set in digital data. As described above, because the TCP/IP based-protocol is applied to the process bus, it is not ensured that the data communication time between the MU 3 and the IED 4 is fixed. Therefore, even when the sampling-synchronization control has been executed on the MU 3, the time at which data from the MU 3 reaches the IED 4 fluctuates within a given range, and thus the IED 4 cannot confirm that the sampling-synchronization control has been executed in the MU 3 in practice. On the other hand, in the current differential relay according to the third embodiment, it is possible to use a determination whether the synchronous control has been executed in the MU 3 in practice. Therefore, it is possible to confirm the sampling synchronization more accurately than the first and second embodiments in which the IED 4 estimates the synchronous control in the MU 3 and executes the same synchronous control as in the MU 3.

While in the first to third embodiments, the process bus-compatible current differential relay has been explained, the relay is not limited to the current differential relay and can also be used for a device that requires the sampling control on the basis of a 1PPS signal from the IED 4. Further, while in the first to third embodiments, a 1PPS signal is used as a sampling-timing control signal, the sampling-timing control signal is not limited to the 1PPS signal. For example, a time synchronization method (a cyclic signal: a signal with a cycle of one second to about several seconds) according to the communication protocol defined in the IEEE 1588 standards can also be used.

The current differential relays according to the embodiments of the present invention are only an example of the content of the present invention, and it can be combined with other publicly known techniques. Moreover, it is needless to mention that the present invention can be configured while modifying it without departing from the scope of the invention, such as omitting a part of the constituent elements of the present invention.

INDUSTRIAL APPLICABILITY

As described above, the present invention is applicable to a current differential relay, and is particularly useful as an invention that can correctly maintain sampling synchronization without being affected by fluctuations in the digital-data communication time from an MU to an TED.

REFERENCE SIGNS LIST

1 power transmission line
2-1, 2-2 instrument transformer
3-1, 3-2 MU (merging unit)
4-1, 4-2 IED (computation unit)
14-1a, 14-2a current data
5 PCM transmission path
6-1, 6-2 process bus (data communication bus)
7-1, 7-2 sampling-timing control-signal cable
10 input transformer
11 filter circuit
12 sample and hold circuit
13 multiplexer circuit
14 AD converter
15, 21 memory circuit
16 control-signal output circuit
16a control signal
17 process-bus transmission circuit
18 sampling-timing control-signal reception circuit
19 data output unit
20 process-bus reception circuit 22 CPU circuit (computation circuit)
23, 23-1, 23-2 signal control unit
24 sampling-timing control-signal transmission circuit
25 1PPS/80f-signal transmission circuit (signal transmission unit)
26 1PPS-signal reception unit (time-signal reception unit)
27 clock circuit
28 PCM reception circuit
29 PCM transmission circuit
31 signal determination unit
32, 48 80f-signal generation unit
33, 33-1 sampling-signal control unit
40 control-amount setting unit
41 synchronous control unit
42 control-amount measurement unit
43, 63 number-of-pieces-of-control-data calculation unit
44, 65 sampling-error determination unit
45 SP-error setting unit
46, 49 sampling-timing control-signal control unit
47, 52 SP-error resetting unit
47-1 first SP-error resetting unit
47-2 second SP-error resetting unit
48-1 1PPS-signal generation unit
50 received-data-number reading unit
51 number-of-pieces-of-data calculation unit
60 sampling-timing control element
61 1PPS-signal reception unit
62 control-amount measurement unit
64 sampling-signal control unit
66 SP-error flag setting unit
67 SP-error flag resetting unit
69 flag setting unit
70 flag-reset detection unit
80, 81 synchronous-control output unit

The invention claimed is:

1. A current differential relay, where the current differential relay is provided in plural, and the current differential relays are provided at both ends of a protected segment and transmit and receive digital data regarding an electric quantity of the relays to and from each other, wherein
the current differential relays, which are provided at both ends of a protected segment, include:
a plurality of merging units each of which merges an electrical input detected in an own terminal, samples the electrical input, converts the electrical input to digital data, and outputs the digital data; and
a plurality of computation units each of which is located apart from a corresponding one of the merging units, is connected to the merging unit through a data communication bus, and performs differential computation using digital data from the merging unit in the own terminal and digital data from the merging unit in another terminal, which is transmitted from the computation unit in the another terminal through a PCM transmission line,
each of the computation units includes:
a signal control unit that derives a time difference in sampling timing between a sampling-timing control signal from the computation unit to the merging unit in the own terminal and a sampling-timing control signal from the computation unit to the merging unit in the another terminal, on a basis of digital data in the own terminal and digital data in the another terminal, that controls a cycle of a sampling-timing control signal on a basis of the time difference, and that outputs the controlled sampling-timing control signal to the merging unit in the own terminal;
a time-signal reception unit that receives a GPS time signal; and
a signal transmission unit that, when the time-signal reception unit normally receives the GPS time signal, transmits a 1PPS signal from the time-signal reception unit to the merging unit in the own terminal as the sampling-timing control signal, and that, when the time-signal reception unit does not normally receive the GPS time signal, transmits an 80f signal from the signal control unit to the merging unit in the own terminal as the sampling-timing control signal, and
each of the merging units includes:
a control-signal output circuit that generates a sampling signal synchronized with the sampling-timing control signal and that outputs the sampling signal as a control signal; and
a data output unit that converts the electrical input to digital data and outputs the digital data on a basis of a control signal from the control-signal output circuit.

2. A current differential relay, where the current differential relay is provided in plural, and the current differential relays are provided at both ends of a protected segment and transmit and receive digital data regarding an electric quantity of the relays to and from each other, wherein
the current differential relays, which are provided at both ends of a protected segment, include:
a plurality of merging units each of which merges an electrical input detected in an own terminal, samples the electrical input, converts the electrical input to digital data, and outputs the digital data; and
a plurality of computation units each of which is located apart from a corresponding one of the merging units, is connected to the merging unit through a data communication bus, and performs differential computation using digital data from the merging unit in the own terminal and digital data from the merging unit in another terminal, which is transmitted from the computation unit in the another terminal through a PCM transmission line,
each of the computation units includes:
a signal control unit that derives a time difference in sampling timing between a sampling-timing control signal from the computation unit to the merging unit in the own terminal and a sampling-timing control signal from the computation unit to the merging unit in the another terminal, on a basis of digital data in the own terminal and digital data in the another terminal, that controls a cycle of a sampling-timing control signal on a basis of the time difference, and that outputs the controlled sampling-timing control signal to the merging unit in the own terminal; and
a computation circuit that performs the differential computation,
the signal control unit sets a synchronization control amount, which is a clock frequency in a merging unit that generates a sampling signal, in each of the merging units, stops computation in the computation circuit or locks a computation output of the computation circuit when the time difference exceeds a predetermined determination value, and cancels stop of computation in the computation circuit or unlocks the computation output of the computation circuit on a basis of the time difference, the synchronization control amount, and the determination value, and each of the merging units includes:
- a control-signal output circuit that generates a sampling signal synchronized with the sampling-timing control signal and that outputs the sampling signal as a control signal; and
- a data output unit that converts the electrical input to digital data and outputs the digital data on a basis of a control signal from the control-signal output circuit.

3. A current differential relay, where the current differential relay is provided in plural, and the current differential relays are provided at both ends of a protected segment and transmit and receive digital data regarding an electric quantity of the relays to and from each other, wherein
the current differential relays, which are provided at both ends of a protected segment, include:
- a plurality of merging units each of which merges an electrical input detected in an own terminal, samples the electrical input, converts the electrical input to digital data, and outputs the digital data; and
- a plurality of computation units each of which is located apart from a corresponding one of the merging units, is connected to the merging unit through a data communication bus, and performs differential computation using digital data from the merging unit in the own terminal and digital data from the merging unit in another terminal, which is transmitted from the computation unit in the another terminal through a PCM transmission line, each of the computation units includes:
- a signal control unit that derives a time difference in sampling timing between a sampling-timing control signal from the computation unit to the merging unit in the own terminal and a sampling-timing control signal from the computation unit to the merging unit in the another terminal, on a basis of digital data in the own terminal and digital data in the another terminal, that controls a cycle of a sampling-timing control signal on a basis of the time difference, and that outputs the controlled sampling-timing control signal to the merging unit in the own terminal; and
- a computation circuit that performs the differential computation, each of the merging units includes:
- a control-signal output circuit that generates a sampling signal synchronized with the sampling-timing control signal and that outputs the sampling signal as a control signal; and
- a data output unit that converts the electrical input to digital data and outputs the digital data on a basis of a control signal from the control-signal output circuit, the control-signal output circuit includes:
- a measurement unit that measures a time difference between a sampling timing of the sampling-timing control signal and a timing of the sampling signal, which is capable of being estimated from the sampling timing;
- a sampling-signal control unit that controls a cycle of the sampling signal on a basis of the time difference and a synchronization control amount, which is a clock frequency in a merging unit that generates the sampling signal, and that synchronizes a timing of the sampling signal with the sampling-timing control signal; and
- a flag setting unit that sets a flag, indicating a sampling-cycle error in the sampling signal, in the data output unit when a time difference measured by the measurement unit exceeds a predetermined determination value and that resets a flag set in the data output unit on a basis of the time difference, the synchronization control amount, and the determination value, and the signal control unit stops computation in the computation circuit or locks a computation output of the computation circuit when the time difference exceeds a predetermined determination value, and cancels stop of computation in the computation circuit or unlocks the computation output of the computation circuit when it is detected that a flag set in the data output unit is reset.

4. The current differential relay according to claim 2, wherein
the control-signal output circuit generates a number to be incremented cyclically each time the sampling signal is generated,
the data output unit assigns the number generated in the control-signal output circuit to the digital data, and
the signal control unit counts the number of the digital data received during a period from a point in time when the time difference exceeds the determination value to a point in time when a next 1PPS signal is output, in order to derive number of pieces of data received during the period, adds the number of pieces of data to number of pieces of data calculated on a basis of the time difference, the synchronization control amount, and the determination value in order to derive a first number of pieces of data, and cancels stop of computation in the computation circuit when a second number of pieces of data received after the time difference exceeds the determination value reaches a value that is larger than the first number of pieces of data.

* * * * *